(12) United States Patent
Rim

(10) Patent No.: US 6,429,061 B1
(45) Date of Patent: Aug. 6, 2002

(54) METHOD TO FABRICATE A STRAINED SI CMOS STRUCTURE USING SELECTIVE EPITAXIAL DEPOSITION OF SI AFTER DEVICE ISOLATION FORMATION

(75) Inventor: Kern Rim, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 09/626,331

(22) Filed: Jul. 26, 2000

(51) Int. Cl.$^7$ ............................................. H01L 21/336
(52) U.S. Cl. ........................ 438/198; 438/167; 438/933
(58) Field of Search .................... 438/167, 198, 438/933, 938; 257/192, 190

(56) References Cited

U.S. PATENT DOCUMENTS

| | | | |
|---|---|---|---|
| 5,158,907 A | | 10/1992 | Fitzgerald, Jr. |
| 5,356,821 A | * | 10/1994 | Naruse et al. ................ 437/34 |
| 5,516,721 A | * | 5/1996 | Galli et al. ................... 437/67 |
| 5,659,187 A | | 8/1997 | Legoues et al. |
| 5,770,484 A | * | 6/1998 | Kleinhenz ................... 438/155 |
| 5,847,419 A | | 12/1998 | Imai et al. |
| 5,891,769 A | * | 4/1999 | Liaw et al. .................. 438/167 |
| 5,977,600 A | * | 11/1999 | Wristers et al. ............. 257/408 |
| 6,051,509 A | * | 4/2000 | Tsuchiaki ............... 438/758 R |
| 6,100,013 A | * | 8/2000 | Brown et al. ............... 430/312 |
| 6,111,267 A | * | 8/2000 | Fischer et al. ................ 257/19 |
| 6,291,845 B1 | * | 9/2001 | Banchard .................... 257/288 |

FOREIGN PATENT DOCUMENTS

| | | | | |
|---|---|---|---|---|
| JP | 408130241 A | * | 5/1996 | ........... H01L/21/76 |
| JP | 410242117 A | * | 9/1998 | ....... H01L/21/3065 |

* cited by examiner

*Primary Examiner*—Caridad Everhart
*Assistant Examiner*—Renzo N. Rocchegiani
(74) *Attorney, Agent, or Firm*—Scully, Scott, Murphy & Presser; Manny W. Schecter

(57) ABSTRACT

A strained Si CMOS structure is formed by steps which include forming a relaxed SiGe layer on a surface of a substrate; forming isolation regions and well implant regions in said relaxed SiGe layer; and forming a strained Si layer on said relaxed SiGe layer. These processing steps may be used in conjunction with conventional gate processing steps in forming a strained MOSFET structure.

12 Claims, 3 Drawing Sheets

METHOD TO FABRICATE A STRAINED SI CMOS STRUCTURE USING SELECTIVE EPITAXIAL DEPOSITION OF SI AFTER DEVICE ISOLATION FORMATION

FIELD OF THE INVENTION

The present invention relates to complementary metal oxide semiconductor (CMOS) device manufacturing, and in particular to a method of forming a strained Si CMOS structure wherein the strained Si channel layer of the structure is formed after conducting various high-temperature processing steps and after conducting various processing steps that typically consume Si.

BACKGROUND OF THE INVENTION

In the semiconductor industry, 'strained Si on SiGe CMOS' essentially refers to CMOS devices fabricated on a substrate that consists of a relatively thin (about 50 to about 300 Å) strained Si layer epitaxially grown on top of a relatively thick (about 300 to about 20,000 Å) relaxed SiGe layer. Publications in the past have shown the potential of achieving high-electron and hole mobilities in strained Si layers. More recent publications have experimentally demonstrated that strained Si layers can be used as a channel region for metal oxide field effect transistors (MOSFETs), and have shown that device performance is enhanced in these structures compared to devices fabricated on conventional Si substrates.

One of the difficulties in realizing strained Si CMOS technology is that the strained layer needs to be protected from high-temperature processing steps during the fabrication process. Exposure to high-temperature processing steps generally relaxes the strain in the strained layer. Moreover, ion implantation, which is typically used in well formation, may damage the strained Si layer degrading the device properties and diminishing the performance enhancements that can be advantageously obtained when using strained Si layers.

Furthermore, the thinner the strained layer is, the larger thermal stress the strained layer can withstand without noticeable device degradation. However, various processing steps including oxidation and etching (e.g., chemical etching and dry etching) consume the top Si layer; thus, in present processing of strained CMOS devices, the epitaxially strained Si layer has to be sufficiently thick to cover the potential thickness loss that may occur during oxidation and/or etching.

In view of the drawbacks mentioned hereinabove with prior art strained Si CMOS technology, there is a continued need to develop new and improved methods whereby the various prior art problems are substantially eliminated. That is, a method of providing a strained Si CMOS device is needed wherein the strained Si layer is formed after most of the high-temperature CMOS processing steps have been completed and after most of the processing steps that consume Si have been completed. Such a method would provide a higher performance device than heretofore possible with prior art strained Si CMOS devices.

SUMMARY OF THE INVENTION

One object of the present invention is to provide a strained Si CMOS device wherein the strained Si layer is not adversely affected by high-thermal budget processing steps.

Another object of the present invention is to provide a strained Si CMOS device in which the strained Si layer is not consumed by processing steps that are known to consume Si in the active device areas, thereby minimizing the required thickness of the strained Si layer.

A further object of the present invention is to provide processing steps of fabricating a strained Si layer which are compatible with existing FET processing steps.

These and other objects and advantages can be achieved in the present invention by utilizing the inventive method wherein the strained Si layer is formed after most of the high-temperature processing steps and after the Si consuming processing steps have been completed.

Specifically, the inventive method comprises the steps of:

(a) forming a relaxed SiGe layer on a surface of a substrate;

(b) forming isolation regions and well implant regions in said relaxed SiGe layer; and forming a strained Si layer on said relaxed SiGe layer.

In one embodiment of the present invention and prior to conducting step (b) above, an optional overlayer is formed on the relaxed SiGe layer. When an overlayer is present, the overlayer is typically removed prior to forming the strained Si layer and the strained Si layer is formed in the area previously occupied by the overlayer.

In the present invention, the strained Si layer may be formed by a selective epitaxial growth process wherein the strained Si layer is formed only in areas of the relaxed SiGe layer that are exposed. Alternatively, a non-selective epitaxial process may be used in forming the strained Si layer. If a non-selective epitaxial growth process is employed, the strained Si layer is formed over the entire structure, and lithography and etching are used to remove the strained Si layer from over the isolation regions The inventive processing steps mentioned above may be used in conjunction with conventional gate processing steps including gate dielectric formation, gate stack formation, source/drain diffusion implantation, and etc. which are capable of forming a FET on the strained Si layer.

Detailed Description of the Invention

Figure 1:
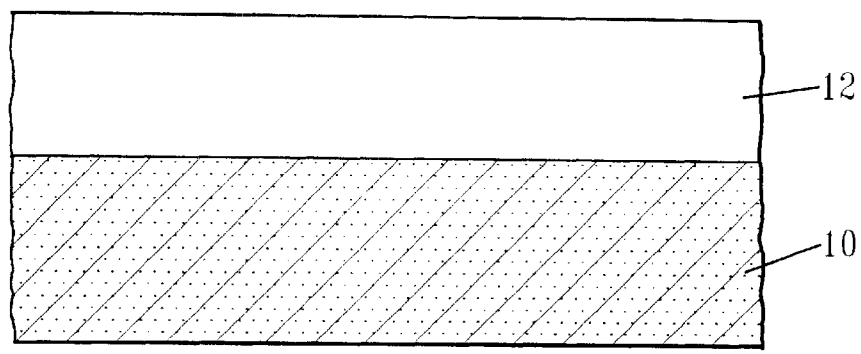
FIGS. 1–3 are pictorial views illustrating the various processing steps of the present invention.

The present invention will now be described in more detail by referring to the drawings that accompany the present application. It is noted that in the accompanying drawings like reference numerals are used for describing like and/or corresponding elements.

Figure 2:
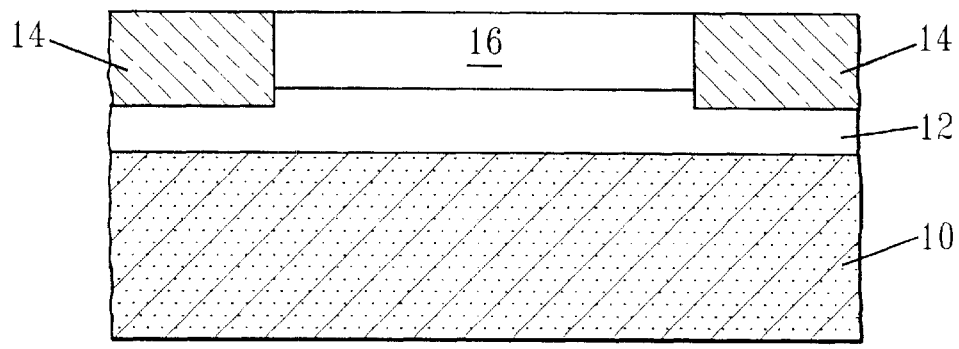
Figure 3:
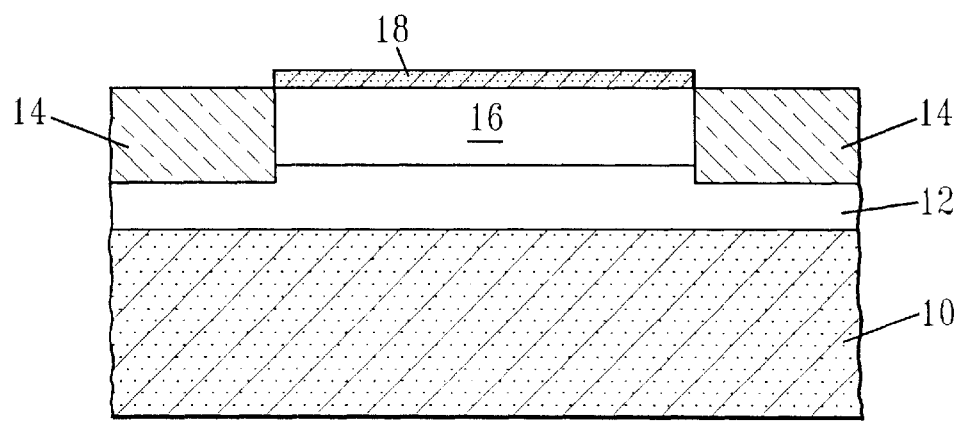

Reference is first made FIGS. 1–3 which illustrate the basic processing steps of the present invention. Specifically, FIG. 1 shows a basic structure that is formed after conducting step (a) of the present invention, i.e., after forming relaxed SiGe layer 12 on a surface of substrate 10. The relaxed SiGe layer is formed on a surface of substrate 10 utilizing any conventional process that is capable of forming such a layer on a substrate. For example, the relaxed SiGe layer may be formed utilizing a conventional growing process such as described in U.S. Pat. No. 5,158,907, a conventional Czochralski crystal pulling process, or epitaxy by solid phase regrowth such as described in U.S. Pat. No. 5,847,419; the contents of the each of the aforementioned U.S. Patents are incorporated herein by reference.

The relaxed SiGe layer is formed on a substrate which may include a semiconducting material such as Si, Ge, SiGe, GaAs, InAs, InP and all other III/V semiconductors, or alternatively, the substrate may be composed of a layered substrate such as Si/SiGe or a silicon-on insulator (SOI).

It is noted that the method by which the relaxed SiGe layer is prepared or the details of the substrate are not critical to the present invention. A critical aspect of the present invention however is that the strained Si layer which will eventually become the channel of the CMOS device is not present at this point of the process. This is unlike prior art processes wherein the strained layer is normally formed at this point.

In one embodiment of the present invention (See FIGS. 5–8), an optional overlayer 13 may be formed on top of the relaxed SiGe layer. When an overlayer is employed, it is formed utilizing a conventional deposition process such as chemical vapor deposition (CVD), plasma-assisted CVD, sputtering, evaporation, spin-on coating, and other like deposition processes. Any material which may serve as a protective layer such as dielectric films or semiconducting layers may be employed in the present invention. For example, $SiO_2$, $Si_3N_4$, SiGe or Si may be used as overlayer 13.

FIG. 2 (and FIG. 6) illustrates the structure that is obtained after formation of isolation regions 14 and well implants 16 in the structure. It should be noted that although the drawings depict the formation of trench isolation regions in the structure, the present invention works well with LOCOS (local oxidation of silicon) isolation regions or other like isolation regions that are well known to those skilled in the art.

The isolation regions are formed utilizing conventional processing techniques well known in the art. In case of the trench isolation regions, as shown in the drawings, the isolation regions are formed by defining the areas for the isolation regions utilizing conventional lithography (photoresist exposure and developed), etching a trench in the structure through the patterned photoresist by a conventional dry etching process such as reactive-ion etching (RIE), plasma etching or ion-beam etching, optionally filling the etched trench with a conventional trench liner material such as $SiO_2$ or $Si_3N_4$, filling the etched trench with a trench dielectric material such as $SiO_2$, and, if needed, conducting a conventional planarization process such as chemicalmechanical polishing (CMP) or grinding.

It is noted that after etching the trench, the patterned photoresist is removed by utilizing any conventional stripping process well known to those skilled in the art.

Figure 6:
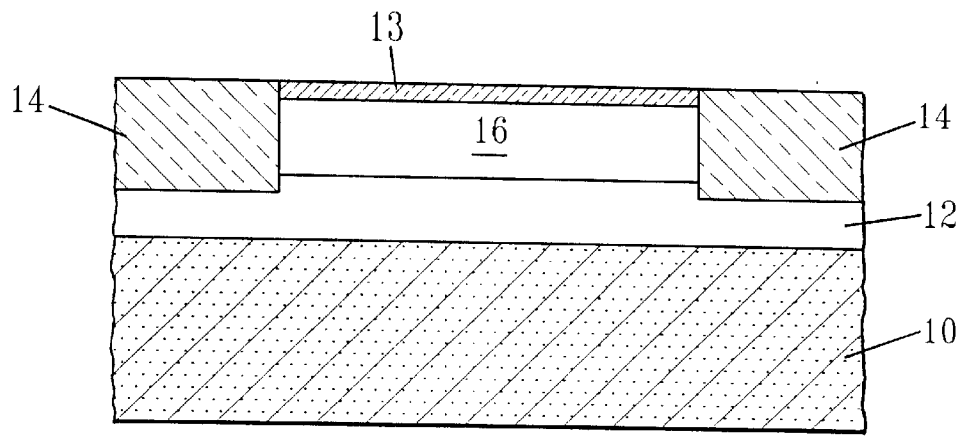

When the structure includes an overlayer, the trench is etched through the overlayer into the relaxed SiGe layer and the isolation regions are formed therein, See FIG. 6.

Well implants 16, which include p-wells or n-wells, are formed in the structure, typically after formation of the isolation regions, utilizing conventional ion implantation and activation annealing processes well known to those skilled in the art. The ion dosage and implant energies may vary depending of the type of dopant to be implanted as well as the desired depth of the well implant. Moreover, the activation annealing temperatures sand times employed in the present invention may also vary. It should be noted that neither the ion implantation nor annealing conditions are critical to the present invention.

Threshold adjust implants or so-called punch through implants (which, for clarity, are not shown in the drawings) may also be formed utilizing conventional ion implantation processes well known to those skilled in the art.

It is noted that at this point of the present invention most of the high-thermal budget processing steps and ion implantation steps are performed. Since the structure at this point of the present process does not include any strained Si layers, the strained layer is not adversely affected by either high-temperature processing or ion implantation.

Figure 7:
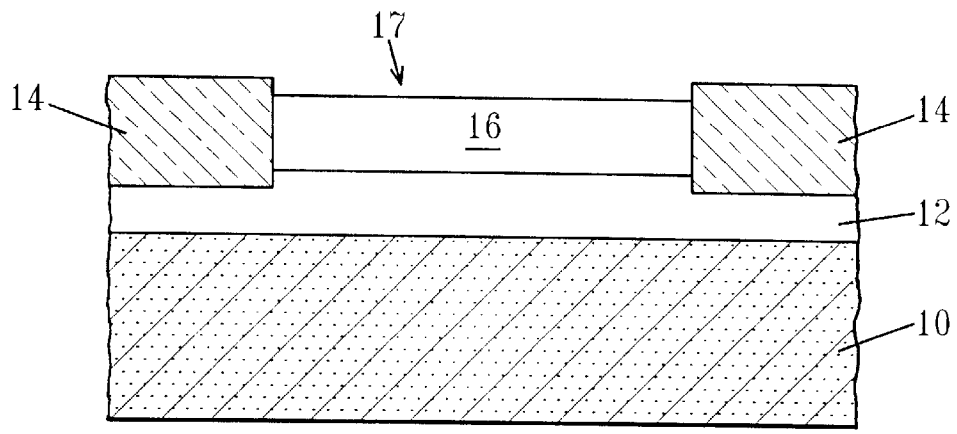
Figure 8:
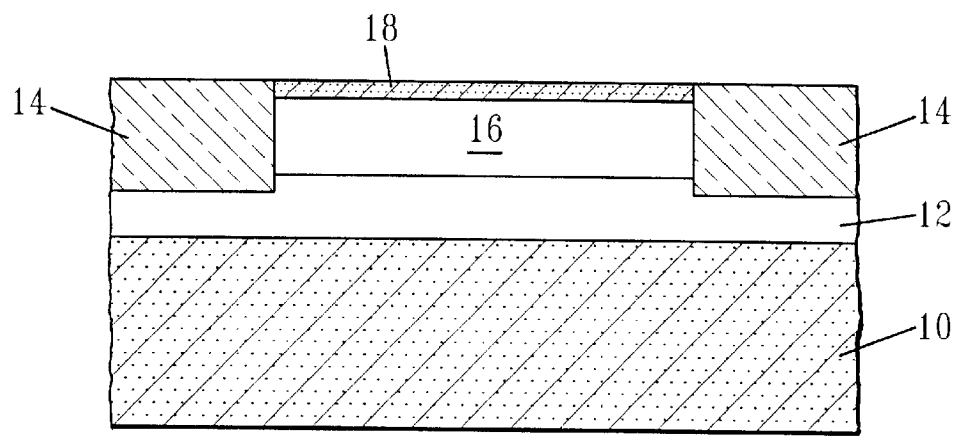

When an optional overlayer is present, some or all of the overlayer may be removed by utilizing a conventional dry or wet chemical etching process or CMP may be employed (See, FIG. 7 in which all the overlayer is removed). As shown in FIGS. 7–8, this step forms a cavity 17 in the structure in which the strained Si layer may be formed.

A conventional wet chemical cleaning step may now be conducted on either the structure shown in FIGS. 2 or 7 Next, and as shown in FIG. 3 (and FIG. 8), strained Si layer 18 is formed on the structure by utilizing either a selective epitaxial ("epi") process or a non-selective epi process. Specifically, CVD or molecular beam epitaxy may be used in forming the strained Si layer.

The selective epi process which is preferred in the present invention grows the strained Si layer on only the areas of the device wherein the relaxed SiGe layer is present. No growth occurs on the isolation regions utilizing the selective epi process. Any conventional selective epi process that is capable of growing a strained Si layer on a relaxed SiGe layer may be employed in the present invention.

The non-selective epi process forms a strained Si layer on all portions of the structure including the isolation regions. When such a process is utilized, the material grown over the isolation regions is removed in a subsequent step by utilizing conventional lithography and etching.

Figure 4:
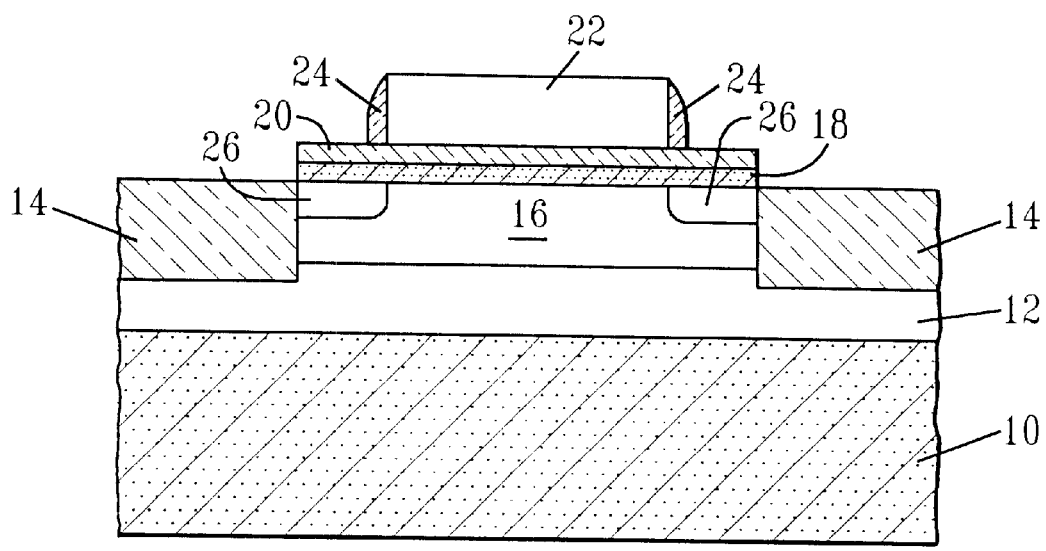
FIG. 4 is a pictorial view illustrating a Si CMOS device that can be fabricated using the basic processing steps of the present invention illustrated in FIGS. 1–3 in conjunction with conventional gate fabrication processing steps.
Figure 5:
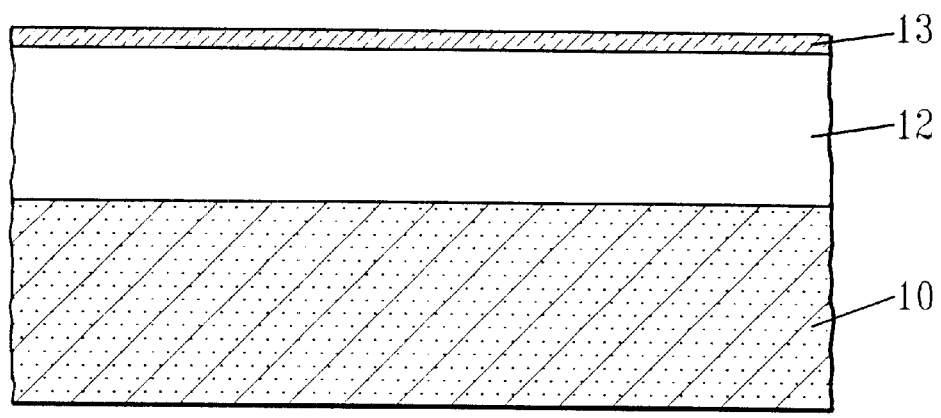
FIGS. 5–8 are pictorial views illustrating an alternative embodiment of the present invention wherein an overlayer is employed.

FIG. 4 shows a final strained Si CMOS structure that can be formed using the processing steps shown in FIGS. 1–3 in conjunction with conventional processing steps that are capable of forming a gate region in the structure. Specifically, the structure in FIG. 4 includes substrate 10, relaxed SiGe layer 12, isolation regions 14, well implants 16, strained Si layer 18, gate dielectric 20, gate conductor 22, sidewall spacers 24, and source/drain diffusion regions 26. A similar structure would be formed using the strained Si layered structure shown in FIG. 8.

It is noted that the gate region depicted in FIG. 4 is formed utilizing any conventional gate formation processing technique well known in the art. This includes, formation, via deposition or thermal growing, of gate dielectric 20, depositing gate conductor 22 on the gate dielectric, patterning the gate region by lithography and etching, forming spacers 24 by deposition and etching, and forming the diffusion regions by ion implantation and annealing. Since such gate formation processes are well known to those skilled in the art, a detailed description concerning the same is not provided herein.

The gate region is also composed of conventional materials well known to those skilled in the art. For example, gate dielectric 20 may be composed of $SiO_2$, $Al_2O_3$, $ZrO_2$ or other like oxides, gate conductor 22 may be composed of a conductive metal, e.g., W, Pt, Co or Ti; polysilicon; a stack including a layer of polysilicon and a conductive metal; a metallic silicide such as $WSi_x$; a stack including polysilicon and a metallic silicide; or other like conductive materials, and spacers 24 are formed of $SiO_2$ or SiN. The gate conductor may also be capped with a hard masking material such as SiN.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described my invention in detail, what I claim as new and desire to secure by the Letters Patent is:

1. A method of fabricating a CMOS structure having a strained Si layer formed therein, said method comprising the steps of:

(a) forming a relaxed SiGe layer on a surface of a substrate;

(b) forming isolation regions and well implant regions in said relaxed SiGe layer; and (c) forming a strained Si layer on said relaxed SiGe layer.

2. The method of claim 1 further comprising forming an overlayer on said relaxed SiGe layer prior to conducting step (b).

3. The method of claim 1 wherein.said relaxed SiGe layer. is formed by a growing process, a Czochralski crystal pulling process or epitaxy by solid phase regrowth.

4. The method of claim 1 wherein said substrate is composed of Si, Ge, SiGe, GaAs, InAs, InP, Si/SiGe or a silicon-on insulator.

5. The method of claim 1 wherein said isolation regions are trench isolation regions of LOCOS regions.

6. The method of claim 5 wherein said isolation are trench isolation regions that are formed by: (i) applying a photoresist to said relaxed SiGe layer; (ii) exposing and developing the photoresist so as to form a pattern therein; (iii) etching through said pattern forming a trench in said relaxed SiGe layer; (iv) filling said a trench with dielectric material; and (v) planarizing.

7. The method of claim 1 wherein said well implants are formed by ion implantation and activation annealing.

8. The method of claim 1 wherein said strained Si layer is formed by a selective epi process or a non-selective epi process.

9. The method of claim 1 wherein said strained Si layer is formed by chemical vapor deposition or molecular beam epitaxy.

10. The method of claim 2 wherein a portion or all of said overlayer is removed prior to conducting step (c) so as to form a cavity between said isolation regions whereby to said strained Si layer will be formed.

11. The method of claim 1 further comprising additional gate formation processing steps.

12. The method of claim 11 wherein said additional gate formation processing steps include: (i) forming a gate dielectric on said strained Si layer; (ii) forming a gate stack on said gate dielectric; (iii) forming sidewall spacers on said gate stack; and (iv) forming source/drain diffusion regions in said structure.

* * * * *

UNITED STATES PATENT AND TRADEMARK OFFICE
CERTIFICATE OF CORRECTION

PATENT NO.   : 6,429,061 B1                                                              Page 1 of 1
DATED        : August 6, 2002
INVENTOR(S)  : K. Rim It is certified that error appears in the above-identified patent and that said Letters Patent is hereby corrected as shown below:

<u>Column 2,</u>
Line 18, "forming" should read -- (c)forming --

<u>Column 5,</u>
Line 24, "wherein.said" should read -- wherein said --

Signed and Sealed this

Twentieth Day of May, 2003

JAMES E. ROGAN
*Director of the United States Patent and Trademark Office*